(12) United States Patent
Wang et al.

(10) Patent No.: US 9,379,921 B2
(45) Date of Patent: Jun. 28, 2016

(54) METHOD FOR PERFORMING DATA SAMPLING CONTROL IN AN ELECTRONIC DEVICE, AND ASSOCIATED APPARATUS

(71) Applicant: MEDIATEK INC., Hsin-Chu (TW)

(72) Inventors: Huai-Te Wang, Taoyuan (TW); Tsung-Hsin Chou, Nantou County (TW); Chih-Hsien Lin, Hsinchu County (TW); Bo-Jiun Chen, New Taipei (TW); Yan-Bin Luo, Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/740,264

(22) Filed: Jun. 16, 2015

(65) Prior Publication Data

US 2016/0056980 A1   Feb. 25, 2016

Related U.S. Application Data

(60) Provisional application No. 62/041,183, filed on Aug. 25, 2014.

(51) Int. Cl.
*H03H 7/40* (2006.01)
*H04L 25/03* (2006.01)
(Continued)

(52) U.S. Cl.
CPC .......... *H04L 25/03057* (2013.01); *H03L 7/087* (2013.01); *H03L 7/091* (2013.01); *H03L 7/095* (2013.01); *H03L 7/099* (2013.01); *H04L 7/0331* (2013.01); *H04L 7/0025* (2013.01)

(58) Field of Classification Search
CPC ......... H03L 7/091; H03L 7/095; H03L 7/087; H03L 7/099; H04L 25/03057

USPC ................. 375/232–233, 371, 373, 375–376; 708/322–323
See application file for complete search history.

(56) References Cited

U.S. PATENT DOCUMENTS 7,315,594 B2 *   1/2008   Schmatz ............... H03L 7/0814
                                                        375/355
7,397,876 B2 *   7/2008   Cranford, Jr. ......... H04L 7/0337
                                                        375/355

(Continued)

OTHER PUBLICATIONS

Yasuo Hidaka, Weixin Gai, et al., "A 4-Channel 10.3Gb/s Backplane Transceiver Macro with 35dB Equalizer and Sign-Based Zero-Forcing Adaptive Control", ISSCC 2009, Feb. 10, 2009, IEEE, USA.

(Continued)

*Primary Examiner* — Khanh C Tran
(74) *Attorney, Agent, or Firm* — Winston Hsu; Scott Margo

(57) ABSTRACT

A method for performing data sampling control in an electronic device and an associated apparatus are provided, where the method includes the steps of: detecting whether a data pattern of a received signal of a decision feedback equalizer (DFE) receiver in the electronic device matches a predetermined data pattern, to selectively trigger a data sampling time shift configuration of the DFE receiver; and when the data sampling time shift configuration is triggered, utilizing a phase shift clock, rather than a normal clock corresponding to a normal configuration of the DFE receiver, as an edge sampler clock of an edge sampler in the DFE receiver, to lock onto edge timing of the received signal, and controlling the phase shift clock and the normal clock to have different phases, respectively, to shift data sampling time of the DFE receiver, for performing data sampling in the DFE receiver.

20 Claims, 8 Drawing Sheets

(51) Int. Cl.
  *H03L 7/091* (2006.01)
  *H03L 7/095* (2006.01)
  *H03L 7/087* (2006.01)
  *H03L 7/099* (2006.01)
  *H04L 7/033* (2006.01)
  *H04L 7/00* (2006.01)

(56) References Cited

U.S. PATENT DOCUMENTS

| | | | | |
|---|---|---|---|---|
| 8,665,940 | B2* | 3/2014 | Palmer | H04L 7/041 |
| | | | | 375/229 |
| 8,774,337 | B2 | 7/2014 | Lee | |
| 2004/0158420 | A1 | 8/2004 | Kim | |
| 2006/0002497 | A1* | 1/2006 | Zhang | H03L 7/0814 |
| | | | | 375/355 |
| 2007/0110199 | A1* | 5/2007 | Momtaz | H04L 7/0331 |
| | | | | 375/350 |
| 2007/0195874 | A1* | 8/2007 | Aziz | H04L 7/0062 |
| | | | | 375/233 |
| 2007/0253475 | A1 | 11/2007 | Palmer | |
| 2009/0237138 | A1* | 9/2009 | Shanbhag | H03D 13/003 |
| | | | | 327/231 |
| 2010/0027606 | A1* | 2/2010 | Dai | H04L 25/03019 |
| | | | | 375/232 |
| 2013/0076412 | A1 | 3/2013 | Shirai | |
| 2014/0169438 | A1 | 6/2014 | Lin | |

OTHER PUBLICATIONS

Brian S. Leibowitz, et al., "A 7.5Gb/s 10-Tap DFE Receiver with First-Tap Partial Response, Spectrally Gated Adaptation, and 2nd-Order Data-Filtered CDR", ISSCC 2007, pp. 176-177 & 590-591, 2007, IEEE, USA.

* cited by examiner

METHOD FOR PERFORMING DATA SAMPLING CONTROL IN AN ELECTRONIC DEVICE, AND ASSOCIATED APPARATUS

CROSS REFERENCE TO RELATED APPLICATIONS

This application claims the benefit of U.S. Provisional Application No. 62/041,183, which was filed on Aug. 25, 2014, and is included herein by reference.

BACKGROUND

The present invention relates to data sampling phase shift topology in a voltage controlled oscillator (VCO) based receiver, and more particularly, to a method for performing data sampling control in an electronic device, and an associated apparatus.

According to the related art, in order to overcome the inter symbol interference (ISI) caused by channel loss, a conventional receiver of a conventional system is typically implemented in a manner of changing the sampling threshold to increase the signal-to-noise ratio (SNR). For example, by adopting a decision feedback equalizer (DFE) structure, the conventional receiver may sample data with different thresholds (e.g. thresholds LEV_H or LEV_L) at different time points to compensate 1st post cursor (or TAP1) based on previous data. However, the jitter margins respectively corresponding to different sides of a sampling time point along the time axis may become different in a situation where the TAP1 level increases, which may degrade the overall performance of the whole conventional system. Thus, a novel method and a corresponding architecture are required to improve the jitter margin while maintaining the minimum latency for a data sample path.

SUMMARY

It is an objective of the claimed invention to provide a method for performing data sampling control in an electronic device, and an associated apparatus, in order to solve the above-mentioned problems.

It is another objective of the claimed invention to provide a method for performing data sampling control in an electronic device, and an associated apparatus, in order to automatically adjust data sampling phase when receiving data in a voltage controlled oscillator (VCO) based receiver.

It is another objective of the claimed invention to provide a method for performing data sampling control in an electronic device, and an associated apparatus, in order to improve the jitter margins while maintaining the minimum latency for a data sample path, and to keep the maximum data transition density for clock and data recovery (CDR).

According to at least one preferred embodiment, a method for performing data sampling control in an electronic device is provided, where the method comprises the steps of: detecting whether a data pattern of a received signal of a decision feedback equalizer (DFE) receiver in the electronic device matches a predetermined data pattern, to selectively trigger a data sampling time shift configuration of the DFE receiver; and when the data sampling time shift configuration is triggered, utilizing a phase shift clock, rather than a normal clock corresponding to a normal configuration of the DFE receiver, as an edge sampler clock of an edge sampler in the DFE receiver, to lock onto edge timing of the received signal, and controlling the phase shift clock and the normal clock to have different phases, respectively, to shift data sampling time of the DFE receiver, for performing data sampling in the DFE receiver, wherein the phase shift clock is a derivative of the normal clock.

According to at least one preferred embodiment, an apparatus for performing data sampling control in an electronic device is provided, where the apparatus comprises at least one portion of the electronic device. The apparatus may comprise a voltage controlled oscillator (VCO) and a control module that is coupled to the VCO. The VCO is arranged for generating clocks for the electronic device. In addition, the control module is arranged for detecting whether a data pattern of a received signal of a decision feedback equalizer (DFE) receiver in the electronic device matches a predetermined data pattern, to selectively trigger a data sampling time shift configuration of the DFE receiver. Additionally, when the data sampling time shift configuration is triggered, the control module utilizes a phase shift clock, rather than a normal clock corresponding to a normal configuration of the DFE receiver, as an edge sampler clock of an edge sampler in the DFE receiver, to lock onto edge timing of the received signal, and controls the phase shift clock and the normal clock to have different phases, respectively, to shift data sampling time of the DFE receiver, for performing data sampling in the DFE receiver, wherein the phase shift clock is a derivative of the normal clock. Further, the clocks comprise the normal clock, and the phase shift clock is not output from the VCO.

It is an advantage of the present invention that the present invention method and the associated apparatus can enhance the overall performance of a system comprising the electronic device. In addition, the present invention method and the associated apparatus can automatically adjust data sampling phase to improve the jitter margins while maintaining the minimum latency for a data sample path, and to keep the maximum data transition density for CDR. As a result, the related art problems (e.g. the problem of unbalanced margins) can be resolved. Additionally, the present invention method and the associated apparatus can adaptively adjust data sampling time, and therefore can precisely track the eye shape of the received signal of the DFE receiver and balance the jitter margins.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
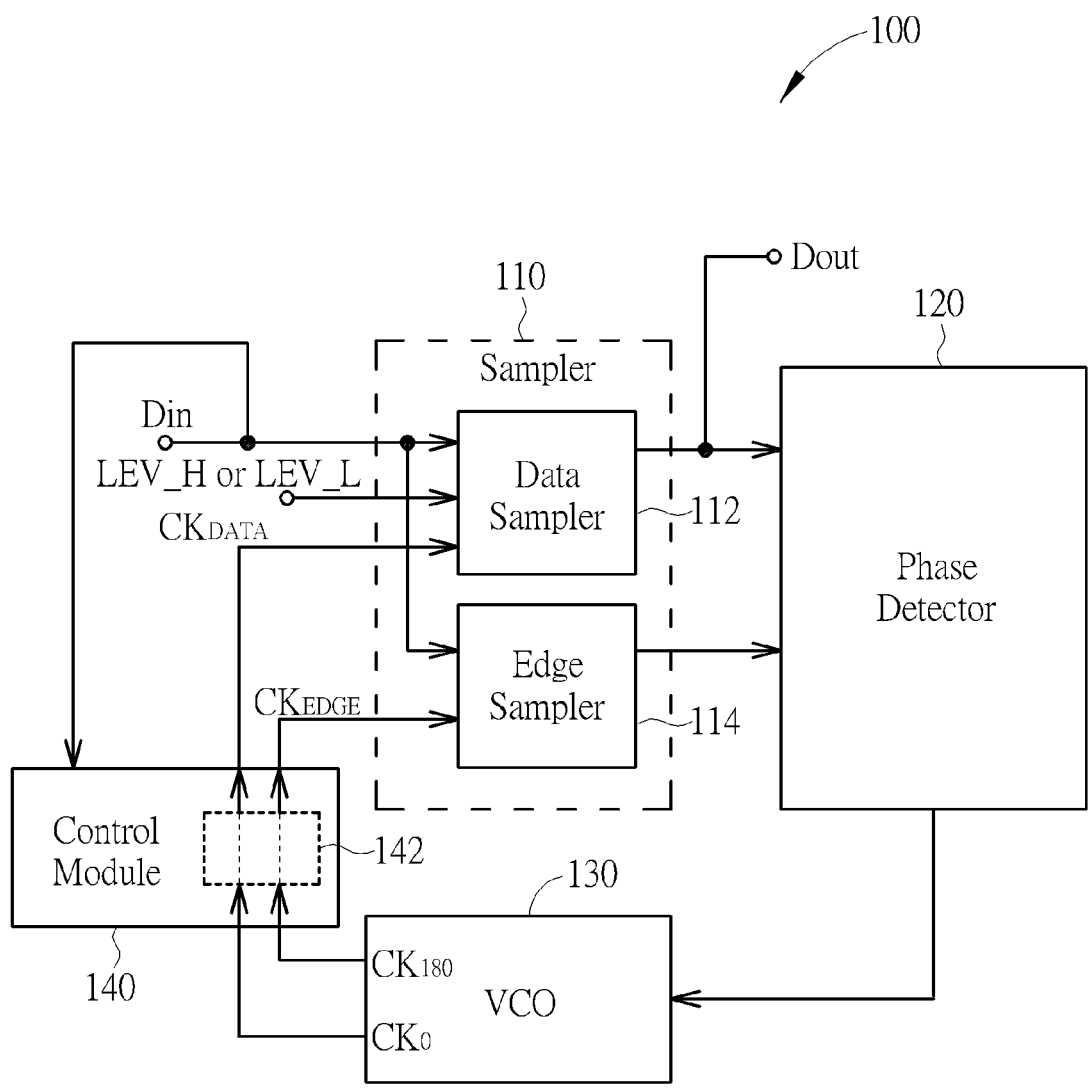
FIG. 1 is a diagram of an apparatus for performing data sampling control in an electronic device according to a first embodiment of the present invention.

FIG. 1 illustrates a diagram of an apparatus 100 for performing data sampling control in an electronic device according to a first embodiment of the present invention, where the apparatus 100 may comprise at least one portion (e.g. a portion or all) of the electronic device. For example, the apparatus 100 may comprise a portion of the electronic device mentioned above, and more particularly, can be at least one hardware circuit such as at least one integrated circuit (IC) within the electronic device and associated circuits thereof. In another example, the apparatus 100 can be the whole of the electronic device mentioned above. In another example, the apparatus 100 may comprise a system comprising the electronic device mentioned above (e.g. a wireless communications system comprising the electronic device). Examples of the electronic device may include, but not limited to, a mobile phone, a tablet, and a personal computer such as a laptop computer or a desktop computer.

As shown in FIG. 1, the apparatus 100 may comprise a set of samplers 110, a phase detector 120, a voltage controlled oscillator (VCO) 130, and a control module 140 that is coupled to the VCO 130. For example, the set of samplers 110 may comprise at least one data sampler, which can be collectively referred to as the data sampler 112, and may comprise an edge sampler 114. In addition, the control module 140 may comprise at least one phase shift circuit, which can be collectively referred to as the phase shift circuit 142. Additionally, at least one portion of the components shown in FIG. 1 may be implemented within a decision feedback equalizer (DFE) receiver in the electronic device. For example, some voltage level threshold such as the thresholds LEV_H or LEV_L can be input into the data sampler 112, for purposes of performing decision feedback equalization, etc., to increase the correctness of the output data obtained from the output terminal Dout of the DFE receiver (i.e. the data carried by the output signal of the DFE receiver that is output from the output terminal Dout), where the correctness of the output data of the DFE receiver may be measured with the bit error rate (BER).

According to this embodiment, the set of samplers 110 is arranged for performing sampling operations on a received signal of the DFE receiver, such as an input signal received from the input terminal Din of the DFE receiver, to generate sampling results. For example, the data sampler 112 may perform sampling operations on the received signal according to a data sampler clock $CK_{DATA}$ (i.e. the reference clock of the data sampler 112) to generate the sampling results of the data sampler 112. In another example, the edge sampler 114 may perform sampling operations on the received signal according to an edge sampler clock $CK_{EDGE}$ (i.e. the reference clock of the edge sampler 114) to generate the sampling results of the edge sampler 114. As a result, the phase detector 120 may perform detection operations (e.g. phase detection operations and/or frequency detection operations) on the sampling results of the data sampler 112 and the sampling results of the edge sampler 114 to control the VCO 130, and more particularly, to temporarily increase or temporarily increase the frequency of at least one clock output from the VCO 130 or to temporarily keep the frequency of the aforementioned at least one clock output from the VCO 130 unvaried, according to the sampling results of the data sampler 112 and/or according to the sampling results of the edge sampler 114. For example, the VCO 130 is arranged for generating clocks for the electronic device, and the frequency of each of these clocks is controlled by the phase detector 120, where examples of these clocks may include, but not limited to, the clock $CK_0$ and the clock $CK_{180}$. When the clock $CK_0$ and the clock $CK_{180}$ are generated, the phase of the clock $CK_0$ can be regarded as the zero phase and the phase of the clock $CK_{180}$ can be regarded as 180 degrees.

In addition, the control module 140 is arranged for performing data pattern detection according to the received signal of the DFE receiver to generate data pattern detection results, and to selectively change the configuration (e.g. hardware configuration) of the DFE receiver in response to the data pattern detection results. As a result of changing the configuration of the DFE receiver, the control module 140 may change at least one clock path within the clock paths between the VCO 130 and the set of samplers 110, and/or may selectively enable or disable some components within the control module 140. According to this embodiment, the control module 140 may utilize the phase shift circuit 142 to adjust the phase of the clock on each clock path of the aforementioned at least one clock path within these clock paths between the VCO 130 and the set of samplers 110. For example, under control of the control module 140, the phase shift circuit 142 may shift the phase of one of the clocks generated by the VCO 110, such as one of the clocks $CK_0$ and $CK_{180}$, and may bypass another of the clocks generated by the VCO 110, such as the other one of the clocks $CK_0$ and $CK_{180}$. Thus, when the apparatus 100 is utilizing the data sampler 112 in the DFE receiver to perform data sampling, the control module 140 can adaptively adjust data sampling time, and therefore the apparatus 100 can precisely track the eye shape of the received signal of the DFE receiver and balance the jitter margins.

Based on the architecture shown in FIG. 1, by changing the configuration of the DFE receiver, the control module 140 may properly perform data sampling control in the electronic device to reduce or prevent the side effect of decision feedback equalization (e.g. the problem of the unbalanced margins due to applying the voltage level threshold such as the thresholds LEV_H or LEV_L to the data sampler 112). Therefore, the apparatus 100 can correctly reproduce the data carried by the received signal and can enhance the overall performance of the whole system comprising the electronic device.

Figure 2:
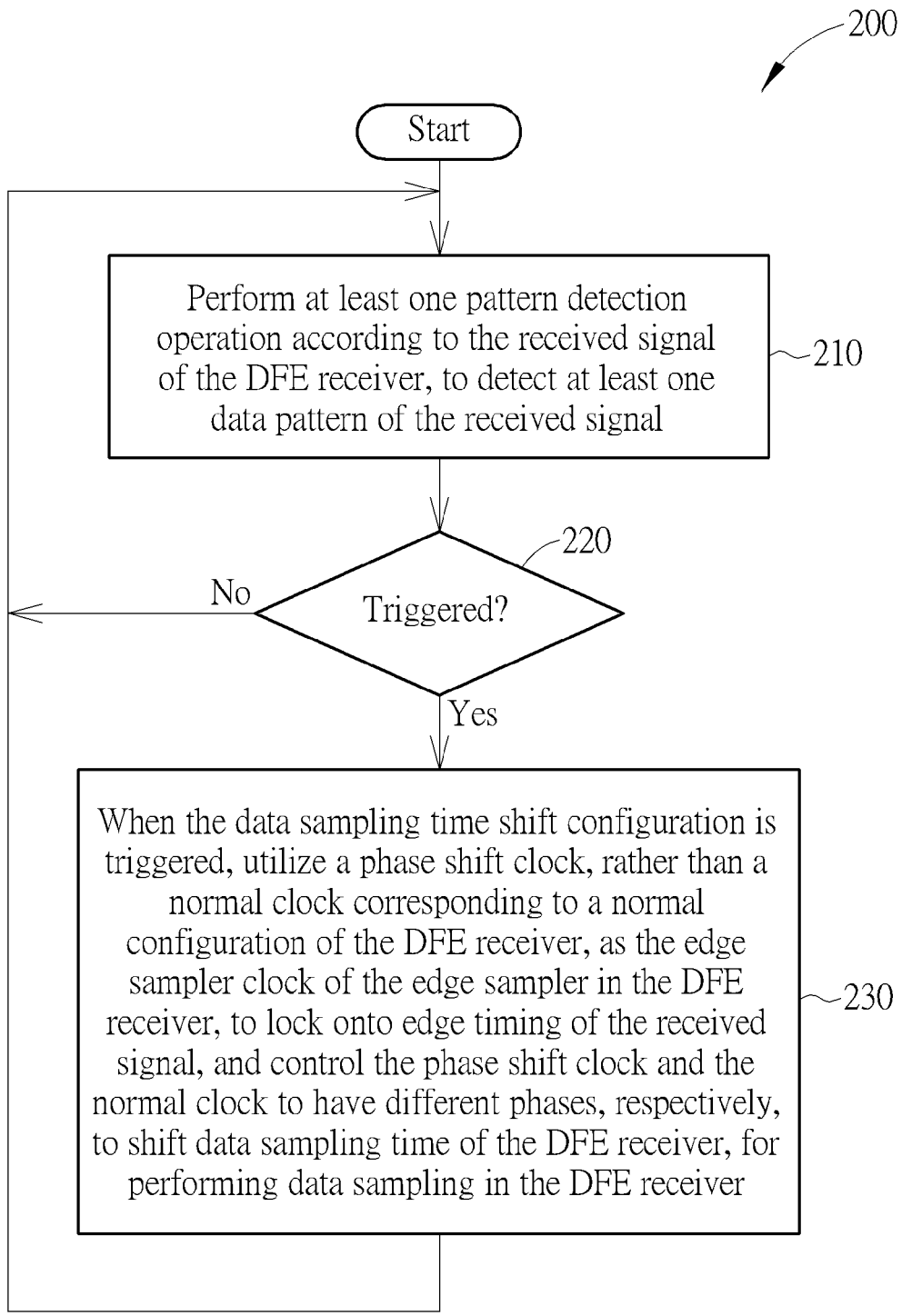
FIG. 2 illustrates a flowchart of a method for performing data sampling control in an electronic device according to an embodiment of the present invention.

FIG. 2 illustrates a flowchart of a method 200 for performing data sampling control in an electronic device according to an embodiment of the present invention. The method 200 shown in FIG. 2 can be applied to the apparatus 100 shown in FIG. 1, and can be applied to the control module 140 thereof. The method can be described as follows.

In Step 210, the control module 140 performs at least one pattern detection operation according to the received signal of the DFE receiver, to detect at least one data pattern of the received signal. For example, the control module 140 shown in FIG. 1 may comprise a pattern detector (not shown) arranged for performing the aforementioned at least one pattern detection operation.

In Step 220, the control module 140 detects whether a data pattern of the received signal of the DFE receiver matches a predetermined data pattern, to selectively trigger a data sampling time shift configuration of the DFE receiver. For example, when it is detected that this data pattern matches the predetermined data pattern, the control module 140 may determine to trigger the data sampling time shift configuration. In another example, the predetermined data pattern mentioned above is one of a plurality of predetermined data patterns, and the data sampling time shift configuration mentioned above is one of a plurality of data sampling time shift configurations of the DFE receiver. In this situation, when it is detected that this data pattern matches the aforementioned one of the plurality of predetermined data patterns, the control module 140 may determine to trigger one of the plurality of data sampling time shift configurations, such as a corresponding data sampling time shift configuration associated with the aforementioned one of the plurality of predetermined data patterns. As a result, based on the detection operation of Step 220, when the data sampling time shift configuration is triggered, Step 230 is entered; otherwise, Step 210 is re-entered.

In Step 230, when the data sampling time shift configuration is triggered, the control module 140 utilizes a phase shift clock (e.g. a derivative of the clock $CK_{180}$), rather than a normal clock (e.g. the clock $CK_{180}$) corresponding to a normal configuration of the DFE receiver, as the edge sampler clock $CK_{EDGE}$ of the edge sampler 114 in the DFE receiver, to lock onto edge timing of the received signal, and controls the phase shift clock and the normal clock to have different phases, respectively, to shift data sampling time of the DFE receiver, for performing data sampling in the DFE receiver. In this embodiment, the phase shift clock is a derivative of the normal clock, and the normal clock is directly output from the VCO 130. As the normal clock such as the clock $CK_{180}$ is output from the VCO 130, the aforementioned clocks generated by the VCO 130 comprise the normal clock, where the phase shift clock such as the derivative of the clock $CK_{180}$ is not output from the VCO 130.

According to this embodiment, the apparatus 100 may utilize the data sampler 112 in the DFE receiver to perform sampling operations on the received signal with the data sampling time shift configuration being triggered. As the clock $CK_0$ can be utilized as the data sampler clock $CK_{DATA}$ of the data sampler 112, the aforementioned clocks generated by the VCO 130 may further comprise the data sampler clock $CK_{DATA}$ of the data sampler 112, and a phase difference between the phase of the data sampler clock $CK_{DATA}$ (e.g. the clock $CK_0$) and that of the normal clock (e.g. the clock $CK_{180}$) can be a constant. In a situation where the phase of the data sampler clock $CK_{DATA}$ (e.g. the clock $CK_0$) and that of the normal clock (e.g. the clock $CK_{180}$) is kept constant, as the control module 140 controls the phase shift clock (e.g. the derivative of the clock $CK_{180}$) and the normal clock (e.g. the clock $CK_{180}$) to have different phases, respectively, and as the control module 140 utilizes the phase shift clock (e.g. the derivative of the clock $CK_{180}$) as the edge sampler clock $CK_{EDGE}$ of the edge sampler 114 in the DFE receiver to lock onto the edge timing of the received signal, the apparatus 100 can adaptively adjust data sampling time, and therefore can precisely track the eye shape of the received signal of the DFE receiver and balance the jitter margins.

According to some embodiments, when the data sampling time shift configuration is triggered, the control module 140 may lock the normal clock (e.g. the clock $CK_{180}$) onto non-zero crossing timing of the received signal to lock the phase shift clock (e.g. the derivative of the clock $CK_{180}$) onto the edge timing of the received signal, where the non-zero crossing timing of the received signal represents the timing that a voltage level of the received signal reaches a predetermined non-zero threshold LEV_XSH. For example, the control module 140 may comprise a sampling time shift sampler (not shown in FIG. 1) that is positioned in the DFE receiver and coupled to the VCO 130. When the data sampling time shift configuration is triggered, the sampling time shift sampler may perform sampling operations on the received signal according to the predetermined non-zero threshold LEV_XSH, to lock the normal clock (e.g. the clock $CK_{180}$) onto the non-zero crossing timing of the received signal. Please note that the sampling time shift sampler of the control module 140 is different from any of the data sampler 112 and the edge sampler 114 in the DFE receiver.

In some of these embodiments, in addition to the phase shift circuit 142, the control module 140 may further comprise a sampling time shift logic circuit (not shown in FIG. 1) that is coupled to the sampling time shift sampler and the phase shift circuit 142, where the phase shift circuit 142 is arranged for generating the phase shift clock (e.g. the derivative of the clock $CK_{180}$). For example, when the data sampling time shift configuration is triggered, the sampling time shift logic circuit may control the phase shift circuit 142 to perform phase shift operations according to the normal clock (e.g. the clock $CK_{180}$) to generate the phase shift clock (e.g. the derivative of the clock $CK_{180}$), and adjusts, by utilizing the phase shift circuit 142, a phase shift between the phase shift clock (e.g. the derivative of the clock $CK_{180}$) and the normal clock (e.g. the clock $CK_{180}$) according to sampling results of the sampling time shift sampler.

In some of these embodiments, the data sampler may perform sampling operations on the received signal according to a predetermined threshold corresponding to the predetermined data pattern mentioned in Step 220. For example, in a situation where the predetermined data pattern mentioned in Step 220 is a High-High-Low (HHL) data pattern (e.g. the data pattern of three continuous bits $\{1, 1, 0\}$ with a high voltage level indicating the logical value 1 and a low voltage level indicating the logical value 0), this predetermined threshold can be the threshold LEV_H. In another example, in a situation where the predetermined data pattern mentioned in Step 220 is a Low-Low-High (LLH) data pattern (e.g. the data pattern of three continuous bits $\{0, 0, 1\}$ with a high voltage level indicating the logical value 1 and a low voltage level indicating the logical value 0), this predetermined threshold can be the threshold LEV_L. In addition, the predetermined non-zero threshold LEV_XSH may be equivalent to this predetermined threshold, or may be equivalent to the product of this predetermined threshold and a predetermined factor FAC. For example, in the situation where the predetermined data pattern mentioned in Step 220 is the HHL data pattern, the predetermined non-zero threshold LEV_XSH may be equivalent to the threshold LEV_H. In another example, in the situation where the predetermined data pattern mentioned in Step 220 is the HHL data pattern, the predetermined non-zero threshold LEV_XSH may be equivalent to the product (LEV_H*FAC) of the threshold LEV_H and predetermined factor FAC. In another example, in the situation where the predetermined data pattern mentioned in Step 220 is the LLH data pattern, the predetermined non-zero threshold LEV_XSH may be equivalent to the threshold LEV_L. In another example, in the situation where the predetermined data pattern mentioned in Step 220 is the LLH data pattern, the predetermined non-zero threshold LEV_XSH may be equivalent to the product (LEV_L*FAC) of the threshold LEV_L and predetermined factor FAC.

According to some embodiments, the control module 140 may comprise the phase shift circuit 142 that is arranged for generating the phase shift clock. When the data sampling time shift configuration is triggered, the phase shift circuit 142 may perform phase shift operations according to the normal clock (e.g. the clock $CK_{180}$) to generate the phase shift clock (e.g. the derivative of the clock $CK_{180}$). For example, the phase shift circuit 142 may comprise a phase interpolator. In addition, when the data sampling time shift configuration is triggered, the phase shift circuit 142 performs the phase shift operations by utilizing the phase interpolator to perform phase interpolation according to the normal clock (e.g. the clock $CK_{180}$). In another example, the phase shift circuit 142 may comprise an adjustable delay line. In addition, when the data sampling time shift configuration is triggered, the phase shift circuit 142 performs the phase shift operations by utilizing the adjustable delay line to delay the normal clock (e.g. the clock $CK_{180}$) to generate the phase shift clock (e.g. the derivative of the clock $CK_{180}$).

According to some embodiments, in a unit interval (UI) corresponding to the received signal, the predetermined data pattern mentioned in Step 220 can be the aforementioned one of the plurality of predetermined data patterns and the data sampling time shift configuration mentioned in Step 220 can be the aforementioned one of the plurality of data sampling time shift configurations of the DFE receiver. In addition, in another UI corresponding to the received signal (e.g. Step 220 is re-entered in another time of performing the loop comprising Step 210, Step 220, and Step 230), the control module 140 may detect whether another data pattern of the received signal of the DFE receiver in the electronic device matches another predetermined data pattern within the plurality of predetermined data patterns, to selectively trigger another data sampling time shift configuration within the plurality of data sampling time shift configurations. For example, when the other data sampling time shift configuration is triggered, the control module 140 is capable of utilizing the phase shift clock (e.g. the aforementioned derivative of the clock $CK_{180}$, or another derivative of the clock $CK_{180}$), rather than the normal clock (e.g. the clock $CK_{180}$) corresponding to the normal configuration of the DFE receiver, as the edge sampler clock $CK_{EDGE}$ of the edge sampler 114 in the DFE receiver, to lock onto the edge timing of the received signal, and controlling the phase shift clock and the normal clock to have different phases, respectively, to shift the data sampling time of the DFE receiver.

For example, in the UI mentioned above, the predetermined data pattern mentioned in Step 220 is the HHL data pattern, and the aforementioned one of the plurality of data sampling time shift configurations of the DFE receiver may cause the predetermined non-zero threshold LEV_XSH to be equivalent to the threshold LEV_H. In addition, in the other UI, the predetermined data pattern mentioned in Step 220 is the LLH data pattern, and the other data sampling time shift configuration of the DFE receiver may cause the predetermined non-zero threshold LEV_XSH to be equivalent to the threshold LEV_L. In another example, in the UI mentioned above, the predetermined data pattern mentioned in Step 220 is the HHL data pattern, and the aforementioned one of the plurality of data sampling time shift configurations of the DFE receiver may cause the predetermined non-zero threshold LEV_XSH to be equivalent to the product (LEV_H*FAC) of the threshold LEV_H and predetermined factor FAC. In addition, in the other UI, the predetermined data pattern mentioned in Step 220 is the LLH data pattern, and the other data sampling time shift configuration of the DFE receiver may cause the predetermined non-zero threshold LEV_XSH to be equivalent to the product (LEV_L*FAC) of the threshold LEV_L and predetermined factor FAC.

Figure 3:
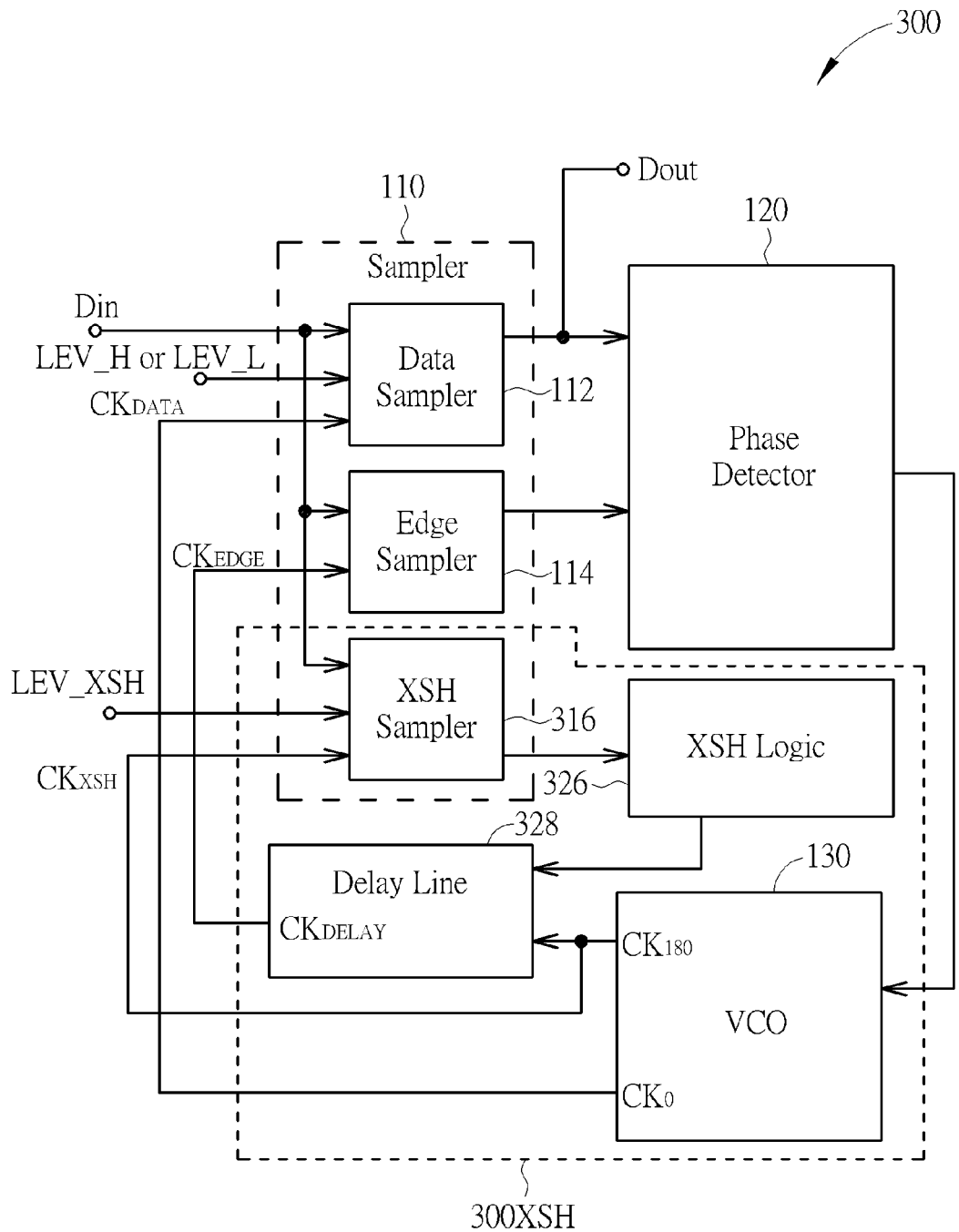
FIG. 3 illustrates a sampling time shift control scheme involved with the method shown in FIG. 2 according to an embodiment of the present invention.

FIG. 3 illustrates a sampling time shift control scheme involved with the method 200 shown in FIG. 2 according to an embodiment of the present invention. The architecture 300 shown in FIG. 3 may comprise a plurality of samplers 310 such as the data sampler 112, the edge sampler 114, and a sampling time shift sampler 316 (labeled "XSH Sampler" in FIG. 3, for brevity), and may further comprise the phase detector 120, the VCO 130, a sampling time shift logic circuit 326 (labeled "XSH Logic" in FIG. 3, for brevity), and a delay line 328. Please note that the sampling time shift sampler 316 can be taken as an example of the sampling time shift sampler mentioned in some embodiments described above, the sampling time shift logic circuit 326 can be taken as an example of the sampling time shift logic circuit mentioned in some embodiments described above, and the delay line 328 can be taken as an example of the phase shift circuit (more particularly, the adjustable delay line) mentioned in some embodiments described above.

As shown in FIG. 3, the VCO 130, the sampling time shift sampler 316, the sampling time shift logic circuit 326, and the delay line 328 can be regarded as a sampling time shift module 300XSH, where the phase shift circuit 142 may comprise at least one portion of the components within the sampling time shift module 300XSH. For example, the phase shift circuit 142 may comprise the delay line 328, and the sampling time shift sampler 316 and the sampling time shift logic circuit 326 are positioned within the control module 140. In another example, the phase shift circuit 142 may comprise the sampling time shift sampler 316, the sampling time shift logic circuit 326, and the delay line 328. According to this embodiment, the sampling time shift sampler 316 may perform sampling operations on the received signal according to the predetermined non-zero threshold LEV_XSH, to lock the normal clock (e.g. the clock $CK_{180}$) onto the aforementioned non-zero crossing timing of the received signal, where the sampling time shift sampler 316 utilizes the clock $CK_{180}$ as the reference clock thereof, i.e. the sampling time shift sampler clock $CK_{XSH}$. For brevity, similar descriptions for this embodiment are not repeated in detail here.

Figure 4:
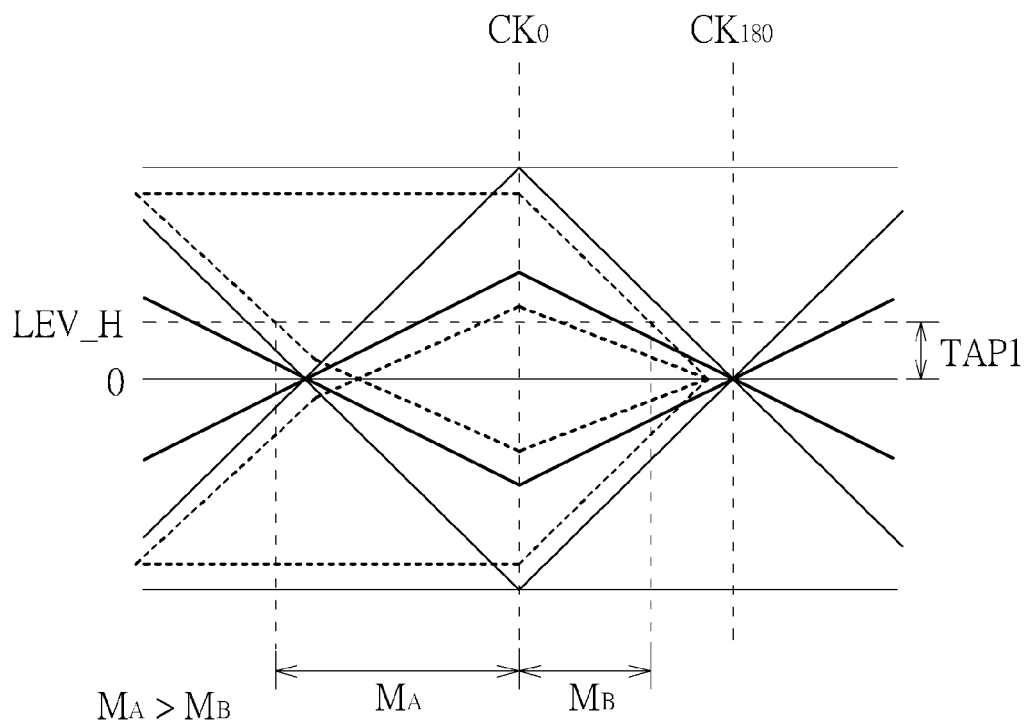
FIG. 4 illustrates an eye diagram indicating some jitter margins in an initialization phase of the sampling time shift control scheme shown in FIG. 3 according to an embodiment of the present invention.

FIG. 4 illustrates an eye diagram indicating some jitter margins $M_A$ and $M_B$ in an initialization phase of the sampling time shift control scheme shown in FIG. 3 according to an embodiment of the present invention, where the jitter margins $M_A$ and $M_B$ may be measured along the time axis of the eye diagram, and the waveforms together with the eyes in the eye diagram are simplified and depicted with line sections for clearly illustrating the jitter margins $M_A$ and $M_B$. For example, in the situation where the predetermined data pattern mentioned in Step 220 is the HHL data pattern, in this initialization phase, the left jitter margin $M_A$ is greater than the right jitter margin $M_B$ (i.e. these jitter margins are unbalanced) since the threshold LEV_H, rather than a zero sampling threshold (labeled "0" in FIG. 4, for better comprehension), is utilized by the data sampler 112 during data sampling. Please note that the absolute value of the threshold LEV_H in this embodiment may be equivalent to the 1st post cursor (or TAP1) level (labeled "TAP1" in FIG. 4, for better comprehension), and therefore, when the TAP1 level is increased, the threshold LEV_H is increased, which may cause the difference between the jitter margins $M_A$ and $M_B$ in this situation to be increased. This is for illustrative purposes only, and is not meant to be a limitation of the present invention.

According to this embodiment, the minimum of the jitter margins $M_A$ and $M_B$ can be regarded as the lateral margin corresponding to the HHL data pattern for the DFE receiver. As these jitter margins are unbalanced because of utilizing the threshold LEV_H, the minimum of the jitter margins $M_A$ and $M_B$ (e.g. the jitter margin $M_B$ corresponding to the HHL data pattern in this embodiment) may be harmful to the performance of the DFE receiver. However, based on the sampling time shift control scheme, the data sampling time can be adaptively adjusted to increase the jitter margin $M_B$ and to balance the jitter margins $M_A$ and $M_B$. In addition, in the initialization phase, the phases of the clock $CK_{DELAY}$ should be calibrated to align with the phase of the clock $CK_{180}$ to make sure that the CDR loop of the architecture 300 can work. The phase relationship is shown in the eye diagram of FIG. 3. For brevity, similar descriptions for this embodiment are not repeated in detail here.

Figure 5:
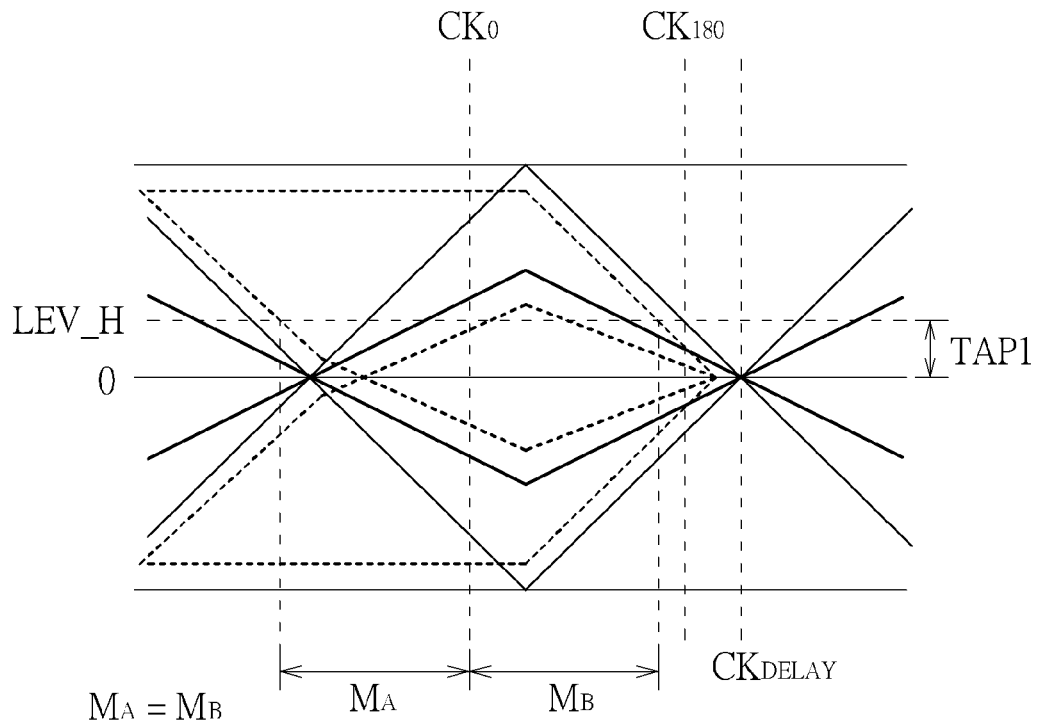
FIG. 5 illustrates an eye diagram indicating some jitter margins in a dynamic tracking phase of the sampling time shift control scheme shown in FIG. 3 according to the embodiment of shown in FIG. 4.

FIG. 5 illustrates an eye diagram indicating some jitter margins $M_A'$ and $M_B'$ in a dynamic tracking phase of the sampling time shift control scheme shown in FIG. 3 according to the embodiment of shown in FIG. 4, where the jitter margins $M_A'$ and $M_B'$ may be measured along the time axis of the eye diagram, and the waveforms together with the eyes in the eye diagram are simplified and depicted with line sections for clearly illustrating the jitter margins $M_A'$ and $M_B'$. For example, in the situation where the predetermined data pattern mentioned in Step 220 is the HHL data pattern, in this dynamic tracking phase, the left jitter margin $M_A'$ may be equal to the right jitter margin $M_B'$ since the architecture 300 shown in FIG. 3 can adaptively adjust the data sampling time. Thus, the present invention method and the associated apparatus can precisely track the eye shape of the received signal of the DFE receiver and balance the jitter margins.

In comparison with the eye diagram shown in FIG. 4, the phases of the clocks $CK_0$ and $CK_{180}$ go backwards as shown in FIG. 5. According to this embodiment, the sampling time shift mechanism of the sampling time shift module 300XSH can be turned on dynamically and it tracks the phases automatically to overcome the temperature drift of delay cells in the adjustable delay line such as the delay line 328. As a result, the timing margins can be balanced as shown in FIG. 5 to compensate the residual inter symbol interference (ISI) at data transition or to compensate the residual precursor effect when the DFE receiver should be equipped with the capability of treating the long channel loss. In addition, due to absent of any additional delay element on the clock path for the clock $CK_0$, the clock mismatch of data samplers (e.g. two data samplers, which can be taken as an example of the aforementioned at least one data sampler) can also be reduced to get the shortest path between the VCO output (e.g. an output terminal of the VCO 130, such as that for outputting the clock $CK_0$) and the data samplers. For brevity, similar descriptions for this embodiment are not repeated in detail here.

Figure 6:
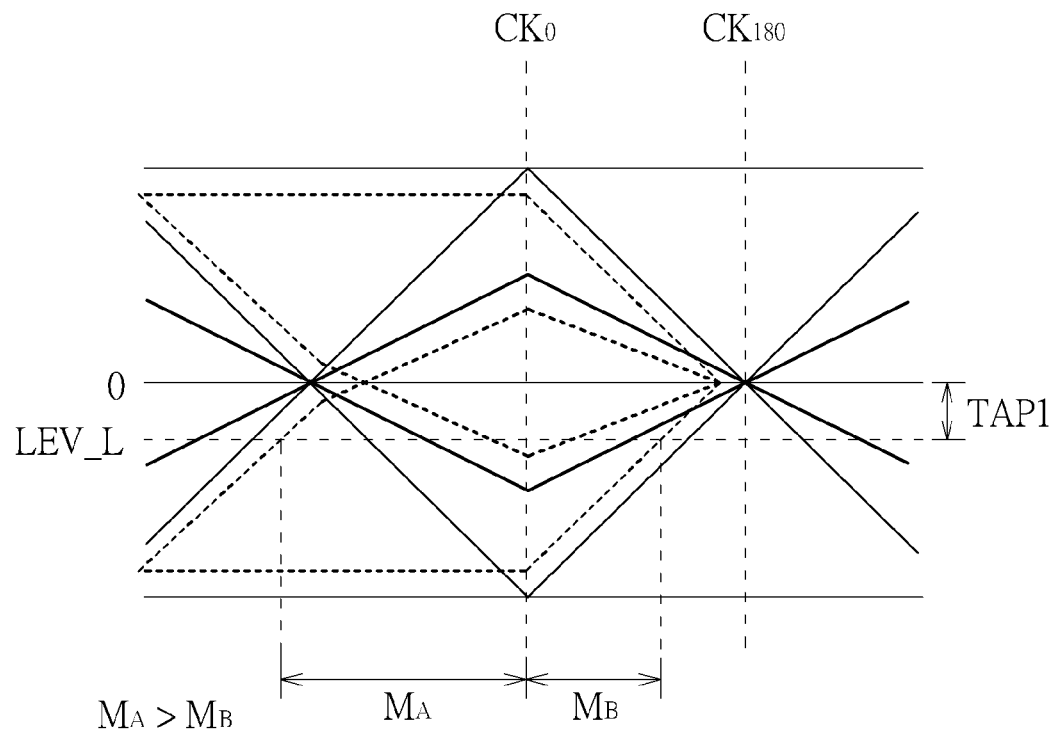
FIG. 6 illustrates an eye diagram indicating some jitter margins in an initialization phase of the sampling time shift control scheme shown in FIG. 3 according to another embodiment of the present invention.

FIG. 6 illustrates an eye diagram indicating some jitter margins $M_A$ and $M_B$ in an initialization phase of the sampling time shift control scheme shown in FIG. 3 according to another embodiment of the present invention, where the jitter margins $M_A$ and $M_B$ may be measured along the time axis of the eye diagram, and the waveforms together with the eyes in the eye diagram are simplified and depicted with line sections for clearly illustrating the jitter margins $M_A$ and $M_B$. For example, in the situation where the predetermined data pattern mentioned in Step 220 is the LLH data pattern, in this initialization phase, the left jitter margin $M_A$ is greater than the right jitter margin $M_B$ since the threshold LEV_L, rather than the zero sampling threshold (labeled "0" in FIG. 6, for better comprehension), is utilized by the data sampler 112 during data sampling. Please note that the absolute value of the threshold LEV_L in this embodiment may be equivalent to the TAP1 level (labeled "TAP1" in FIG. 6, for better comprehension), and therefore, when the TAP1 level is increased, the threshold LEV_L is decreased, which may cause the difference between the jitter margins $M_A$ and $M_B$ in this situation to be increased.

According to this embodiment, the minimum of the jitter margins $M_A$ and $M_B$ can be regarded as the lateral margin corresponding to the LLH data pattern for the DFE receiver. As these jitter margins are unbalanced because of utilizing the threshold LEV_L, the minimum of the jitter margins $M_A$ and $M_B$ (e.g. the jitter margin $M_B$ corresponding to the LLH data pattern in this embodiment) may be harmful to the performance of the DFE receiver. However, based on the sampling time shift control scheme, the data sampling time can be adaptively adjusted to increase the jitter margin $M_B$ and to balance the jitter margins $M_A$ and $M_B$. In addition, in the initialization phase, the phases of the clock $CK_{DELAY}$ should be calibrated to align with the phase of the clock $CK_{180}$ to make sure that the CDR loop of the architecture 300 can work. The phase relationship is shown in the eye diagram of FIG. 3. For brevity, similar descriptions for this embodiment are not repeated in detail here.

Figure 7:
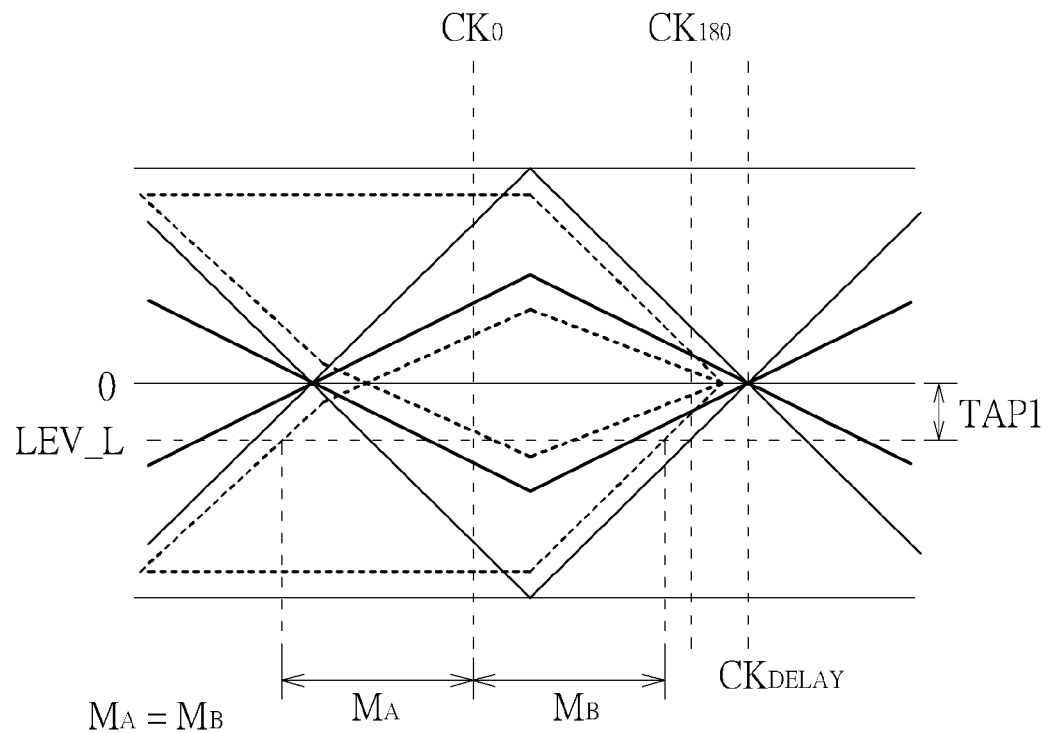
FIG. 7 illustrates an eye diagram indicating some jitter margins in a dynamic tracking phase of the sampling time shift control scheme shown in FIG. 3 according to the embodiment of shown in FIG. 6.

FIG. 7 illustrates an eye diagram indicating some jitter margins $M_A'$ and $M_B'$ in a dynamic tracking phase of the sampling time shift control scheme shown in FIG. 3 according to the embodiment of shown in FIG. 6, where the jitter margins $M_A'$ and $M_B'$ may be measured along the time axis of the eye diagram, and the waveforms together with the eyes in the eye diagram are simplified and depicted with line sections for clearly illustrating the jitter margins $M_A'$ and $M_B'$. For example, in the situation where the predetermined data pattern mentioned in Step 220 is the LLH data pattern, in this dynamic tracking phase, the left jitter margin $M_A'$ may be equal to the right jitter margin $M_B'$ (i.e. these jitter margins may be balanced) since the architecture 300 shown in FIG. 3 can adaptively adjust the data sampling time. Thus, the present invention method and the associated apparatus can precisely track the eye shape of the received signal of the DFE receiver and balance the jitter margins.

In comparison with the eye diagram shown in FIG. 6, the phases of the clocks $CK_0$ and $CK_{180}$ go backwards as shown in FIG. 7. According to this embodiment, the sampling time shift mechanism of the sampling time shift module 300XSH can be turned on dynamically and it tracks the phases automatically to overcome the temperature drift of delay cells in the adjustable delay line such as the delay line 328. As a result, the timing margins can be balanced as shown in FIG. 7 to compensate the residual ISI at data transition or to compensate the residual precursor effect when the DFE receiver should be equipped with the capability of treating the long channel loss. In addition, due to absent of any additional delay element on the clock path for the clock $CK_0$, the clock mismatch of data samplers (e.g. two data samplers, which can be taken as an example of the aforementioned at least one data sampler) can also be reduced to get the shortest path between the VCO output and the data samplers. For brevity, similar descriptions for this embodiment are not repeated in detail here.

Figure 8:
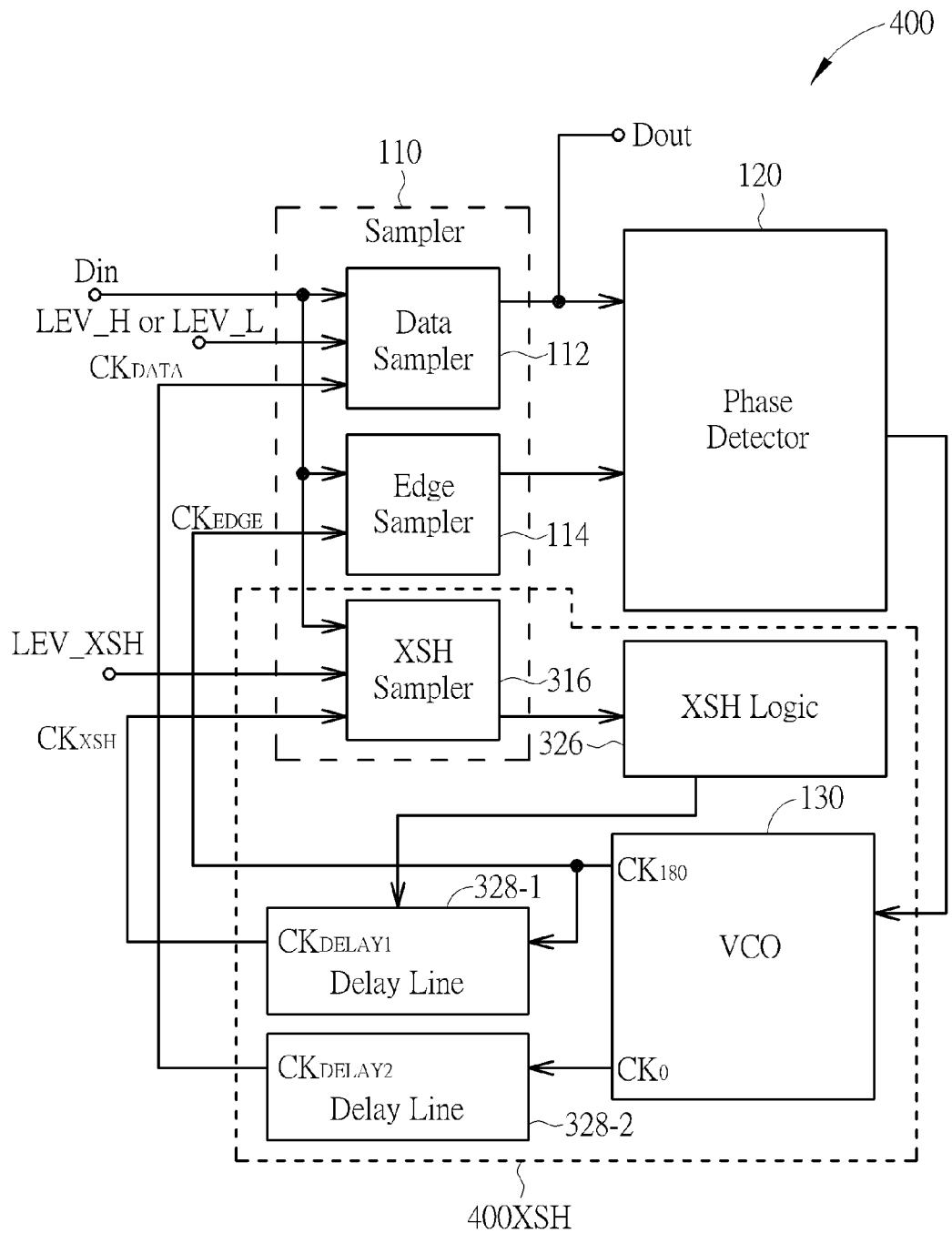
FIG. 8 illustrates a sampling time shift control scheme involved with the method shown in FIG. 2 according to another embodiment of the present invention.

FIG. 8 illustrates a sampling time shift control scheme involved with the method shown in FIG. 2 according to another embodiment of the present invention. The architecture 400 shown in FIG. 8 may comprise some components of the architecture 300 shown in FIG. 3, and may further comprise two delay lines 328-1 and 328-2. As the delay line 328 is replaced by the two delay lines 328-1 and 328-2, the clock $CK_{DELAY}$ of the embodiment shown in FIG. 3 is replaced by the clocks $CK_{DELAY1}$ and $CK_{DELAY2}$ in the embodiment. In addition, as the sampling time shift module 300XSH shown in FIG. 3 is replaced by the sampling time shift module 400XSH in this embodiment, the sampling time shift sampler 316 can still perform sampling operations on the received signal according to the predetermined non-zero threshold LEV_XSH, where the sampling time shift sampler 316 utilizes the clock $CK_{DELAY1}$ as the reference clock thereof, i.e. the sampling time shift sampler clock $CK_{XSH}$. The architecture 400 shown in FIG. 8 can adaptively adjust data sampling time, too, and therefore can precisely track the eye shape of the received signal of the DFE receiver and balance the jitter margins. For brevity, similar descriptions for this embodiment are not repeated in detail here.

Please note that, in architecture 300 shown in FIG. 3, the sampling time shift module 300XSH may comprise the delay line 328 for phase shifting or phase adjustment. This is for illustrative purposes only, and is not meant to be a limitation of the present invention. According to some embodiments, the delay line 328 may be replaced by a phase interpolator, which may be controlled by the sampling time shift logic circuit 326 to achieve dynamic tracking results similar to that of the architecture 300 shown in FIG. 3. For brevity, similar descriptions for this embodiment are not repeated in detail here.

In addition, in the architecture 400 shown in FIG. 8, the sampling time shift module 400XSH may comprise the two delay lines 328-1 and 328-2 for phase shifting or phase adjustment, and both of the two delay lines 328-1 and 328-2 may be controlled by the sampling time shift logic circuit 326 to achieve dynamic tracking results similar to that of the architecture 300 shown in FIG. 3. This is for illustrative purposes only, and is not meant to be a limitation of the present invention. According to some embodiments, the two delay lines 328-1 and 328-2 may be replaced by two phase interpolators, both of which may be controlled by the sampling time shift logic circuit 326 to achieve dynamic tracking results similar to that of the architecture 300 shown in FIG. 3. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing data sampling control in an electronic device, the method comprising the steps of:
    utilizing a voltage controlled oscillator (VCO) to generate clocks for the electronic device;
    detecting whether a data pattern of a received signal of a decision feedback equalizer (DFE) receiver in the electronic device matches a predetermined data pattern, to selectively trigger a data sampling time shift configuration of the DFE receiver; and
    when the data sampling time shift configuration is triggered, utilizing a phase shift clock, rather than a normal clock corresponding to a normal configuration of the DFE receiver, as an edge sampler clock of an edge sampler in the DFE receiver, to lock onto edge timing of the received signal, and controlling the phase shift clock and the normal clock to have different phases, respectively, to shift data sampling time of the DFE receiver, for performing data sampling in the DFE receiver, wherein the phase shift clock is a derivative of the normal clock;
    wherein the clocks comprise the normal clock, and the phase shift clock is not output from the VCO.

2. The method of claim 1, wherein a phase difference between a phase of a data sampler clock of a data sampler in the DFE receiver and that of the normal clock is a constant; and the method further comprises:
    utilizing the data sampler to perform sampling operations on the received signal with the data sampling time shift configuration being triggered.

3. The method of claim 1, wherein the step of utilizing the phase shift clock as the edge sampler clock of the edge sampler in the DFE receiver to lock onto the edge timing of the received signal further comprises:
    when the data sampling time shift configuration is triggered, locking the normal clock onto non-zero crossing timing of the received signal to lock the phase shift clock onto the edge timing of the received signal, wherein the non-zero crossing timing of the received signal represents timing that a voltage level of the received signal reaches a predetermined non-zero threshold.

4. The method of claim 3, further comprising:
    when the data sampling time shift configuration is triggered, utilizing a sampling time shift sampler in the DFE receiver to perform sampling operations on the received signal according to the predetermined non-zero threshold, to lock the normal clock onto the non-zero crossing timing of the received signal, wherein the sampling time shift sampler is different from a data sampler in the DFE receiver.

5. The method of claim 4, wherein the step of controlling the phase shift clock and the normal clock to have the different phases respectively to shift the data sampling time of the DFE receiver further comprises:
    when the data sampling time shift configuration is triggered, performing phase shift operations according to the normal clock to generate the phase shift clock, and adjusting a phase shift between the phase shift clock and the normal clock according to sampling results of the sampling time shift sampler.

6. The method of claim 4, wherein the data sampler performs sampling operations on the received signal according to a predetermined threshold corresponding to the predetermined data pattern; and the predetermined non-zero threshold is equivalent to the predetermined threshold, or is equivalent to a product of the predetermined threshold and a predetermined factor.

7. The method of claim 1, wherein the step of controlling the phase shift clock and the normal clock to have the different phases respectively to shift the data sampling time of the DFE receiver further comprises:
    when the data sampling time shift configuration is triggered, performing phase shift operations according to the normal clock to generate the phase shift clock.

8. The method of claim 7, wherein the step of performing the phase shift operations according to the normal clock to generate the phase shift clock further comprises:

when the data sampling time shift configuration is triggered, performing the phase shift operations by utilizing a phase interpolator to perform phase interpolation according to the normal clock.

9. The method of claim 7, wherein the step of performing the phase shift operations according to the normal clock to generate the phase shift clock further comprises:
when the data sampling time shift configuration is triggered, performing the phase shift operations by utilizing an adjustable delay line to delay the normal clock to generate the phase shift clock.

10. The method of claim 1, wherein the predetermined data pattern is one of a plurality of predetermined data patterns, and the data sampling time shift configuration is one of a plurality of data sampling time shift configurations of the DFE receiver; and the method further comprises:
detecting whether another data pattern of the received signal of the DFE receiver in the electronic device matches another predetermined data pattern within the plurality of predetermined data patterns, to selectively trigger another data sampling time shift configuration within the plurality of data sampling time shift configurations; and
when the other data sampling time shift configuration is triggered, utilizing the phase shift clock, rather than the normal clock corresponding to the normal configuration of the DFE receiver, as the edge sampler clock of the edge sampler in the DFE receiver, to lock onto the edge timing of the received signal, and controlling the phase shift clock and the normal clock to have different phases, respectively, to shift the data sampling time of the DFE receiver.

11. An apparatus for performing data sampling control in an electronic device, the apparatus comprising at least one portion of the electronic device, the apparatus comprising:
a voltage controlled oscillator (VCO) arranged for generating clocks for the electronic device;
a control module, coupled to the VCO, arranged for detecting whether a data pattern of a received signal of a decision feedback equalizer (DFE) receiver in the electronic device matches a predetermined data pattern, to selectively trigger a data sampling time shift configuration of the DFE receiver, wherein when the data sampling time shift configuration is triggered, the control module utilizes a phase shift clock, rather than a normal clock corresponding to a normal configuration of the DFE receiver, as an edge sampler clock of an edge sampler in the DFE receiver, to lock onto edge timing of the received signal, and controls the phase shift clock and the normal clock to have different phases, respectively, to shift data sampling time of the DFE receiver, for performing data sampling in the DFE receiver, wherein the phase shift clock is a derivative of the normal clock;
wherein the clocks comprise the normal clock, and the phase shift clock is not output from the VCO.

12. The apparatus of claim 11, wherein the clocks comprise a data sampler clock of a data sampler in the DFE receiver, and a phase difference between a phase of the data sampler clock and that of the normal clock is a constant; and the apparatus utilizes the data sampler to perform sampling operations on the received signal with the data sampling time shift configuration being triggered.

13. The apparatus of claim 11, wherein when the data sampling time shift configuration is triggered, the control module locks the normal clock onto non-zero crossing timing of the received signal to lock the phase shift clock onto the edge timing of the received signal, wherein the non-zero crossing timing of the received signal represents timing that a voltage level of the received signal reaches a predetermined non-zero threshold.

14. The apparatus of claim 13, wherein the control module comprises:
a sampling time shift sampler, positioned in the DFE receiver and coupled to the VCO, wherein when the data sampling time shift configuration is triggered, the sampling time shift sampler performs sampling operations on the received signal according to the predetermined non-zero threshold, to lock the normal clock onto the non-zero crossing timing of the received signal;
wherein the sampling time shift sampler is different from a data sampler in the DFE receiver.

15. The apparatus of claim 14, wherein the control module further comprises:
a phase shift circuit, arranged for generating the phase shift clock; and
a sampling time shift logic circuit, coupled to the sampling time shift sampler and the phase shift circuit, wherein when the data sampling time shift configuration is triggered, the sampling time shift logic circuit controls the phase shift circuit to perform phase shift operations according to the normal clock to generate the phase shift clock, and adjusts, by utilizing the phase shift circuit, a phase shift between the phase shift clock and the normal clock according to sampling results of the sampling time shift sampler.

16. The apparatus of claim 14, wherein the data sampler performs sampling operations on the received signal according to a predetermined threshold corresponding to the predetermined data pattern; and the predetermined non-zero threshold is equivalent to the predetermined threshold, or is equivalent to a product of the predetermined threshold and a predetermined factor.

17. The apparatus of claim 11, wherein the control module comprises:
a phase shift circuit, arranged for generating the phase shift clock, wherein when the data sampling time shift configuration is triggered, the phase shift circuit performs phase shift operations according to the normal clock to generate the phase shift clock.

18. The apparatus of claim 17, wherein the phase shift circuit comprises a phase interpolator; and when the data sampling time shift configuration is triggered, the phase shift circuit performs the phase shift operations by utilizing the phase interpolator to perform phase interpolation according to the normal clock.

19. The apparatus of claim 17, wherein the phase shift circuit comprises an adjustable delay line; and when the data sampling time shift configuration is triggered, the phase shift circuit performs the phase shift operations by utilizing the adjustable delay line to delay the normal clock to generate the phase shift clock.

20. The apparatus of claim 11, wherein the predetermined data pattern is one of a plurality of predetermined data patterns, and the data sampling time shift configuration is one of a plurality of data sampling time shift configurations of the DFE receiver; and the control module is further arranged for detecting whether another data pattern of the received signal of the DFE receiver in the electronic device matches another predetermined data pattern within the plurality of predetermined data patterns, to selectively trigger another data sampling time shift configuration within the plurality of data sampling time shift configurations; and when the other data sampling time shift configuration is triggered, the control module utilizes the phase shift clock, rather than the normal clock corresponding to the normal configuration of the DFE receiver, as the edge sampler clock of the edge sampler in the DFE receiver, to lock onto the edge timing of the received signal, and controls the phase shift clock and the normal clock to have different phases, respectively, to shift the data sampling time of the DFE receiver.

* * * * *